United States Patent
Alvarez, Jr. et al.

(10) Patent No.: US 6,391,090 B1
(45) Date of Patent: May 21, 2002

(54) METHOD FOR PURIFICATION OF LENS GASES USED IN PHOTOLITHOGRAPHY

(75) Inventors: Daniel Alvarez, Jr.; Jeffrey J. Spiegelman, both of San Diego, CA (US)

(73) Assignee: Aeronex, Inc., San Diego, CA (US)

( * ) Notice: Subject to any disclaimer, the term of this patent is extended or adjusted under 35 U.S.C. 154(b) by 0 days.

(21) Appl. No.: 09/824,382

(22) Filed: Apr. 2, 2001

(51) Int. Cl.$^7$ ................................. B01D 53/04
(52) U.S. Cl. .................. 95/116; 95/117; 95/129; 95/137; 95/139; 95/143
(58) Field of Search .................. 95/116, 117, 129, 95/131, 132, 133, 135, 137, 141–143, 902, 273, 139, 140; 423/230

(56) References Cited

U.S. PATENT DOCUMENTS

| | | | |
|---|---|---|---|
| 4,855,276 A | * 8/1989 | Osborne et al. | 502/415 |
| 5,607,647 A | * 3/1997 | Kinkead | 422/122 |
| 5,685,895 A | 11/1997 | Hagiwara et al. | |
| 5,910,292 A | 6/1999 | Alvarez, Jr. et al. | |
| 6,059,859 A | 5/2000 | Alvarez, Jr. et al. | |
| 6,103,206 A | 8/2000 | Taylor, Jr. et al. | |

OTHER PUBLICATIONS

Dallas, Andrew J. et al. "Protecting the DUV Process and Optimizing Optical Transmission" in Meterology, Inspection, and Process Control for Microlithography XIV, Neal T. Sullivan, Editor, Proceedings of SPIE vol. 3998, pp. 863–874 (2000).
Holmes, S. J. et al. "Manufacturing with DUV Lithography" in *IBM Journal of Research and Development*, vol. 41, Optical Lithography (1997).
Kishkovich, Oleg et al. "Real–Time Methodologies for Monitoring Airborne Molecular Contamination in Modern DUV Photolithography Facilities" in part of the SPIE Conference on Meterology, Inspection, and Process Control in Microlthography XII vol. 3677, pp. 348–376. (Mar. 1999).
Kishkovich, Oleg et al. "An Accelerated Testing Technique for Evaluating Performance of Chemical Air Filters for DUV Photolithographic Equipment" in part of the SPIE Conference on Meterology, Inspection, and Process Control in Microlthography XIII vol. 3677, pp. 857–865. (Mar. 1999).
MacDonald, Scott A. et al. "Airborne Contamination of a Chemically Amplified Resis. 1. Identification of Problem" *Chem. Mater* vol. 5, pp. 348–356 (1993).
Zhu, Sheng–Bai "Contamination Control during Shipping, Handling and Storage of Reticles" In Meterology, Inspection, and Process Control for Microlithography XIV, Neal T. Sullivan, Editor Proceedings of SPIE vol. 3998, pp. 565–572 (2000).
Ullmans's Encyclopedia of Industrial Chemistry, Completely Revised Fifth Edition, Editors Barbara Elvers and Stephen Hawkins, vol. 28A, pp. 475–490 (1985).
Kirk–Othmer Encyclopedia of Chemical Technology, Third Edition, vol. 15 pp. 639–655, 1339–1369 (1978).

* cited by examiner

*Primary Examiner*—David A. Simmons
*Assistant Examiner*—Frank M. Lawrence
(74) *Attorney, Agent, or Firm*—Brown Martin Haller & McClain

(57) ABSTRACT

A method and composition for the removal of contaminants in a gas stream used in the contamination sensitive processes of photolithography and metrology are described. The synergistic effect of a combination of an electropositive metal component, a high silica zeolite, and a late transition metal compound effects removal or reduction of the contaminates in the gas which interfere with light transmittance to the ppb or ppt levels necessary for the gas to be suitable for these uses. The removal of neutral polar molecules, neutral polar aprotic molecules, protic and aprotic alkaline molecules, acidic polar species, and neutral non-polar aprotic molecules is accomplished with the claimed composition. Depending on the type of contaminant, the composition components are each varied from 10 to 80 parts by volume, with the total composition limited to 100 parts by volume.

25 Claims, 1 Drawing Sheet

METHOD FOR PURIFICATION OF LENS GASES USED IN PHOTOLITHOGRAPHY

BACKGROUND OF THE INVENTION

1. Field of the Invention

The invention herein relates to the purification of gas. More particularly, it pertains to the purification of gases which are used in production of contaminationsensitive products.

2. Description of the Background

The circuitry on semiconductor chips is normally formed by photolithography. Each layer of the chip has a photoresist mask which defines the circuitry for that layer. Ultraviolet laser produced light is used to expose the photoresist and create the image of the circuitry on the chip layer.

The degree of definition of the circuit lines on the chip is a function of the wavelength of the laser light. As circuitry has become more complex, more and more circuit lines are being crowded into each unit area on the semiconductor layer. Not only does this mean that the lines themselves must be narrower, but it also means that their definition must be more precise to avoid either interference and short circuiting with neighboring lines or breaks (opens) in an individual line. The relationship between the ultraviolet light wavelength and the width of the circuit lines is direct: narrower circuit lines require shorter ultraviolet light wavelengths. Conversely, the shorter wavelengths of ultraviolet light have higher energies. Ultraviolet is generally defined as wavelengths between 400 nanometers (nm) and about 10 nm. Other regions of interest are Near Ultraviolet (NUV), which is approximately 400 to 300 nm; Deep Ultraviolet (DUV), which is approximately 300 to 100 nm; and Extreme Ultraviolet (EUV), which is approximately $\leq 100$ nm. Currently commercial semiconductor production processes operate with 248 nm (KrF) and 193 nm (ArF) ultraviolet light wavelengths which allow production of circuit lines with widths of approximately 0.15 micrometers ($\mu$m). The industry currently projects that the line widths of 0.10 $\mu$m and smaller will become the standard shortly, which will require photolithography with ultraviolet light wavelengths of 157 nm.

Photolithography of semiconductor wafers is conducted in closed chambers with the laser lens and the target wafer being surrounded by a gaseous atmosphere. The gases used in process environments vary from compressed dry air (CDA) to inert gases. Common examples are CDA, He, $N_2$, and He/$O_2$ mixtures. Different manufacturers, processes, wavelengths of light, and other requirements favor different gases. As the field advances to lower wavelengths of light, i.e. more energetic light, inert gases will likely become dominant, especially $N_2$ and He.

It is normal, however, for the gas itself to be contaminated with small amounts of reactive gases or vapors or particulate materials. All these contaminants can and do affect the production process in various ways. Molecular contaminants with absorbances in the UV range reduce the optical transmittance of the lithography tool. Residues, deposits, and condensates form on the optical components of the lithography tool which reduce light transmittance. The photoacids generated by photoresists during the lithography process are sensitive to quenching by molecular contaminants, especially alkaline contaminants like ammonia. In sub-248 nm lithography, these contaminants can be found in some or all of the components of the lithography tool.

A limited number of decontamination processes and products have been used in the past to produce "lens gases" of acceptable levels of purity. Most notable of these are carbon beds and particulate filters. As the required circuit line width and therefore the ultraviolet light wavelengths have decreased, however, decontamination processes which were once sufficient have become unacceptable because the degree of residual contamination has been found to be too high under the newer, more stringent requirements.

Metrology is the field within the semiconductor industry that is responsible for testing the wafer at various stages in the fabrication process. Wafers are tested by metrology devices throughout their manufacturing to ensure compliance and eliminate defective wafers. Metrology limits must always exceed the resolution limits of the lithographic processes. As device dimensions shrink metrology limits must follow suit, which will lead to greater contamination susceptibility in the metrology environment. Two technologies currently dominate the metrology market: optical metrology and electron beam metrology. Purification of the gases in the metrology environment is crucial to the accuracy of metrology.

For example, optical metrology devices may be within or outside the lithography tool itself. When the device is in the tool the metrology optics and laser beam become an integral part of the lithography tool. These systems are used for continuous monitoring of masks and reticles. The necessity of gas purification is the same as for the lithography tool environment.

In-line optical measurements are found outside the lithography environment. For example, ellipsometry tools are commonly used to measure thin-film uniformity after spin-on resist application. The photoresists in ellipsometers and interferometers are susceptible to molecular contamination from the environment.

CD-SEM is used as an inline metrology tool that has a high resolution. Although CD-SEM operation is conducted in a high vacuum chamber, the chamber is periodically opened to atmospheric contaminants, therefore, the purity of the purge gas is crucial in ensuring long-term tool stability. Additionally, the cassette(s) may be contained in a chemically purified environment to minimize their contamination. Furthermore, SEM reticle inspection systems may require purification to minimize damage to the reticle from molecular contaminants, especially when exotic materials become essential in future technology modes. Reticles may adsorb contaminants then desorb under process conditions.

The electron beam in CD-SEM produces charge contaminants in wafers. These occur when electrons are ejected from or adsorbed by the wafer surface. Therefore, another metrology tool must non-destructively measure the charge contamination after SEM and must also be contained in a decontaminated environment.

There are two kinds of contaminants that need to be considered in any purification process: those that are in the lens gas originally and those that get injected into the gas stream during the purification process. The contaminants commonly present in the lithography environment are water ($H_2O$), hydrocarbons ($H_xC_y$), oxides of nitrogen ($NO_x$), oxides of sulfur ($SO_x$), ammonia ($NH_3$), organic amines ($R_3N$), metals ($M^+$), halogenated and sulfonated hydrocarbons (RX, X=F, Cl, Br, I, $SO_3$), siloxanes ($Si_xH_y$), alcohols (ROH), sulfides ($R_2S$), and halogen hydrides (HX, where X=F, Cl, Br or I), among others. Certain groups of contaminants present different problems in photolithography.

i. The group of neutral polar protic molecules—e.g., $H_2O$ and ROH—absorb radiation in the sub-248 nm range, condense easily on surfaces, and stabilize other polar contaminants by forming solvation complexes.

ii. The group of neutral polar aprotic molecules—e.g., $NO_x$, $SO_x$, $R_2S$, and RX—absorb radiation in the sub-248 nm range and react with other contaminants to form harmful products. For example, the formation of ammonium sulfate residues on optical surfaces, known as optical hazing.

iii. The group of alkaline molecules, both protic and aprotic—e.g., amines, including ammonia—absorb in the sub-248 nm range; react with other contaminants; and quench the photoacid generated in the resist film. This quenching results in an undesirable T-shaped resist profile, known as T-topping.

iv. The group of acidic polar species, both Lewis (M+) and Bronsted (HX), absorb in the sub-248 nm range and react with other contaminants, mainly from Group (i), to form harmful acidic products. Bronsted acids on metal lead to loss of process control because the photoresists are based on specific acid content based on a timed release agent. Additional acid interferes with the control.

v. The group of neutral non-polar aprotic molecules—e.g., hydrocarbons and siloxanes—absorb in the sub-248 nm range, condense easily on surfaces, and are ubiquitous in the cleanroom environment. Under high energy conditions, hydrocarbons will leave a carbonaceous residue on the lens. Siloxanes can form an opaque layer of $SiO_2$ on the lens.

vi. The group of environmental gases—e.g., $CO_2$, and CO—absorb in the sub-248 nm range and are ubiquitous in the cleanroom environment.

Contaminants also get injected into the gas stream during the purification process commonly from the decontamination material itself. For example, upstream carbon beds can release particulate contamination. Decontamination materials are normally high surface area solid materials either in granular form or as surface coatings on solid substrates. The flow of the gas being decontaminated or the process of surface adsorption can cause minute particulates to be generated from the decontamination material and entrained in the gas stream. Moreover, it is well known that the mixtures and concentrations of contaminants in gas streams vary from photolithography process to process and from gas vendor to gas vendor. Therefore, operators of individual photolithography processes must shop for different decontamination products depending on their specific process. Since most decontamination products have relatively narrow use limitations, in many cases a process operator cannot find an optimum decontamination product for the specific process and must compromise its decontamination specifications.

To eliminate contaminants from the lithography system, some or all of the components of the lithography tool are enclosed in sealed compartments. FIG. 1 demonstrates a typical lithography tool. The entire microlithography tool has not commonly been enclosed in its own chamber, but the trend toward improved molecular purity will require such isolation of the environment within the tool. Since the wafer must be placed in the laser path and removed from the tool, the environment must be constantly refreshed. Therefore, point-of-use purification of the lithography tool gas is necessary. In contrast, the laser is normally enclosed in a permanently sealed compartment. The laser is often sealed at its manufacturing facility, which is usually in a separate location from the tool assembly. The disadvantage to this practice is that it requires that a decontamination composition must also function for the lifetime of the laser. Therefore, purification of laser gas both prior to and during laser assembly, as well as point-of-use purification, is necessary.

The optics compartment is generally sealed from the rest of the tool environment, but it is often accessed by the operators, whereas the laser is not. Even if the entire lithography tool is contained in a purified environment, the optics portion will be further isolated, as it is not opened to the external environment as frequently as the lithography tool. Therefore, purification of the gases contained in the optics compartment, both at the manufacturing facility and point-of-use is necessary.

Typically, the gases present in the equipment are CDA, $N_2$, He or Ar, and/or $He/O_2$. Specifically, in the tool compartment and optics compartment, all of these gases may be present. In the laser compartment, N2 and He or Ar may be present. In scanning electron microscopy and other metrology tools, CDA and $N_2$ are present. In the future, He or Ar may be used for these measuring tools.

Critical dimension (CD) quality and processing efficiency may also benefit from isolation and purification of the environments of various additional device uses in the semiconductor industry, e.g. bake ovens and metrology equipment. It may also become possible and beneficial to isolate the entire process of semiconductor manufacturing, from bare wafers to functional chips. Therefore, purification during assembly and point of use throughout the semiconductor industry is necessary.

It will therefore be evident that as the photolithography technology advances to lower ultraviolet light wavelengths and lower width microcircuitry lines the degree of decontamination of the lens gases must become greater, both for the removal of the original contaminants in the gas and also for the prevention of creation and injection of particulate contaminants into the gas during the decontamination process.

The Semiconductor Industry Association recommends that acceptable levels for all contaminants be in the 10–100 ppt (parts per trillion) range over the next few years. Problems have arisen in reaching that goal. Contaminant levels and decontamination requirements vary widely and depend on the gas, process, wavelength of light, and CD requirements. Other factors that increase the difficulty of reaching this goal include: the wide range of gaseous environments in different tools and different compartments within the tools, the wide range of possible contaminants and wide range of possible concentrations, the presence of non-atmospheric contaminants in combination with atmospheric contaminants, and the interference of certain contaminants with the attempted removal of other contaminants.

A single formulation capable of accomplishing sub-ppb levels for all contaminants does not presently exist. Some current purification technologies require energetic activation, either with heat or electrical stimulation, which may adversely affect the contamination levels by outgassing and by-product formation. Some purification technologies release particulate components that become entrained in the gas stream, especially at high pressure. Further, some purification technologies require periodic regeneration, replacement, and/or activation during the serviceable lifetime of the lithography tool. This causes an interruption in production and may increase the likelihood of outgassing, by-product formation, and/or particulate entraining.

SUMMARY OF THE INVENTION

The invention herein overcomes the deficiencies of the prior decontaminating agents and provides single composition decontamination products which can be used for point-of-use decontamination of a wide variety of contaminant gases in lens gas streams, can be precisely formulated for individual specific decontamination projects, and lasts the entire serviceable lifetime of the device. The invention is a class of compositions that comprise three types of materials which function together to allow decontamination of lens gases down to a level of sub-ppb (parts per billion), preferably less than 100 parts per trillion (ppt), a level previously unattainable by existing technology. Furthermore, this level of decontamination is becoming necessary in the field of UV photolithography and metrology.

Decontamination at sub-ppb levels, preferably less than 100 ppt, is accomplished by combining a novel contaminant adsorbing material with two known contaminant adsorbing materials. Synergy between the three materials produces previously unattainable levels of purification. The first material is a high surface area oxide of an electropositive transition metal or lanthanide metal. The second material is a high silica zeolite. The third material is an oxide of a late transition metal or a reduced late transition metal supported on a high surface area inorganic material.

The ratios of the three components may be varied according to the formula $aA+bB+cC=1$, where a, b, and c each is in the range of 0.1–0.8. The concentrations of the three principal components of the composition can be varied to enable the composition to be used for decontamination of a wide variety of potential contaminant gases in the photolithography gas stream. The composition limits are from 10 to 80 percent by volume of each component. Thus by selecting the appropriate ratios of the components, a composition of the present invention can be tailored precisely to the specific mix of contaminants in the gas stream for individual processes. The range of possible compositions is defined by the area within the dashed line A-B-C in FIG. 2. As used herein, "inert" means that the gas is inert to the operating components of the photolithography or metrology process and its products. The "inert" gases of the present invention include, but are not limited to, gases commonly labeled "noble" or "inert" generally in the gas industry.

As noted, the lens gases which are of principal interest and most widely used in the photolithography processes are nitrogen, CDA, helium, Ar, and helium/oxygen mixtures, although it is anticipated that the present compositions will be useful with any inert lens gas compositions, including gas compounds or mono-elemental gases which may be formulated or specified for individual unique situations. The gases should not conflict with the absorption. For example. $O_2$ is not a contaminant at any wavelength other than 157 nm, since it absorbs light there. Therefore, the gas must be chosen by user with the intended UV wavelength in mind.

Of most interest for the present invention is removal or reduction of contaminants which absorb light at the commercially important wavelengths of 248 nm, 193 nm and 157 nm, although removal or reduction of contaminants which absorb throughout the DUV range down to $\leq 100$ nm is contemplated. Such absorption is believed to be an important mechanism of interference with the photolithography process, since it reduces the amount of functional available DUV light.

Specifically, the compositions of this invention comprise 10 to 80 percent by volume of an electropositive metal; 10 to 80 percent by volume of a high silica zeolite; and 10 to 80 percent by volume of a late transition metal compound, with the total being 100 percent by volume.

The compositions are capable of removing both atmospheric and non-atmospheric contaminants to sub-ppb levels from the purge gases used in various environments pertaining to NUV, DUV, and EUV photolithography. The invention removes neutral polar molecules—e.g. $H_2O$ and ROH; neutral polar aprotic molecules eg. $NO_x$, $SO_x$, $R_2S$, and RX; alkaline molecules, both protic and aprotic—e.g. amines, including ammonia; acidic polar species, both Lewis (M+) and Bronsted (HX); and neutral non-polar aprotic molecules—e.g., hydrocarbons and siloxanes.

The invention also removes particulate matter, but it is preferred that particulate removal devices or systems be positioned upstream of the inventive decontamination compositions in the inert lens gas flow stream to reduce the particulate load of the gas stream to a low level. Such particulate removal systems and devices are readily available, and their use reduces the service requirements on the present compositions and make them more available for their principal function, removal of the gaseous and vaporous contaminants from the gas stream.

The compositions of the present invention also provide the advantageous property that they do not themselves contribute any contaminants to the gas streams. They do not generate particulates in any significant amount nor do they release reaction products of the adsorbed gases. Thus they do not produce any "injected" contamination into the gas stream.

The present invention operates at a variety of pressures and is sufficiently stable under the operating conditions as to prevent particulates from becoming entrained in the gas stream.

The compositions of the present invention also have long service lives. They will operate effectively for five to seven years or more, which time span represents the normal service life of a photolithography tool. The invention does not require regeneration or energetic activation during the entire serviceable lifetime.

DETAILED DESCRIPTION AND PREFERRED EMBODIMENTS

Figure 1:
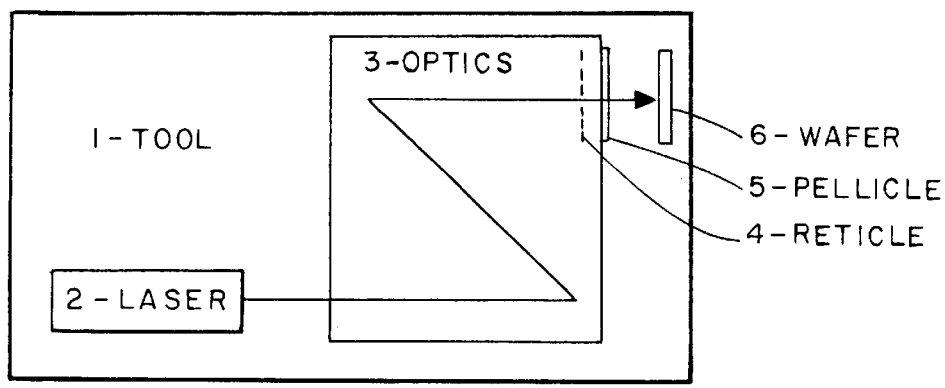
FIG. 1 is a schematic diagram of a typical lithography tool, illustrating the typical compartments where decontaminates gas may be present.

The invention is best understood by descriptions of the three principal components of the present compositions: the high surface area electropositive metal component, the high silica zeolite component, and the late transition metal oxide. (In the descriptions and claims herein, all concentrations are in parts or percent by volume unless otherwise stated.

Synergy between the three materials produces previously unattainable levels of purification. It is the synergy between the three materials that is highly effective. The first two components (electropositive metals and high silica zeolite) are used herein to effect the removal of certain contaminants that interfere with the action of the third component (late transition metal compounds). Likewise, the first component removes contaminants that potentially interfere with the sorbent capacity of the second component. Therefore, the presence of all three of these materials is necessary to affect the desired sub-ppb, preferably less than 100 ppt, levels of decontamination. The ratios of the three materials are adjusted according to the formula $aA+bB+cC=1$, where a, b, and c each is in the range of 0.1–0.8, depending upon the specific decontamination needs.

The Electropositive Metal Component

The electropositive metal component comprises certain electropositive metals (Groups 3 and 4 metals, the lanthanide metals and vanadium) and their salts and oxides. These provide an affinity for water and with a surface area of at least about 140 m$^2$/g and can be used very effectively to reduce water content in the inert lens gas streams down to the order of 1 ppb or lower. They are also effective in removal of hydrocarbon gases and carbon oxides from the lens gas stream. The metals, oxides and salts must be compatible (i.e., nonreactive) with all gases in the lens gas stream to be dried.

The described electropositive metals, metal oxides and salts have been found to provide unique specific properties synergistically to the present compositions. Specifically they will be metals, metal oxides and metal salts of the electropositive Group 3 metals (scandium, yttrium and lanthanum), Group 4 metals (titanium, zirconium and hafnium), vanadium, and the lanthanide metals (cerium, praseodymium, neodymium, samarium, europium, gadolinium, terbium, dysprosium, holmium, erbium, thulium, ytterbium and lutetium). (Promethium and actinium also fall within this group, but since they are unstable they are not of interest in this invention.). Preferred among the various materials which are useful herein as dehydration agents are titania, zirconia, yttria and vanadia.

The metals, oxides, or salts of this component will have surface areas of at least 140 m$^2$/g, preferably in the range of 140–1200 m$^2$/g, commonly in the range of 140–500 m$^2$/g. There are currently a limited number of commercially available materials with this high level of surface area, and which also meet the other requirements described. It is anticipated that additional suitable materials will become commercially available in the future and it is to be understood that such forthcoming materials are considered to be within the scope of this invention.

Preferably the high surface area metal, metal oxide or salt decontaminating agent will be a high surface area titania. However, numerous other metal oxides or salts, such as zirconia, yttria or vanadia with adequate surface areas will be also satisfactory. The preferred titania has a surface area in the range of 140–250 m$^2$/g and is a product commercially available from the Engelhard Minerals and Chemicals Corporation as a petrochemical catalyst for olefin transformation reactions.

It is preferred to activate the electropositive metal component prior to incorporation of the compositions into the lens gas system. Activation can be accomplished by heating the high surface area agent in an anhydrous inert gas atmosphere (e.g., N$_2$ or Ar gas) at a temperature of about 250°–425° C. (480°–800° F.) for about 24–48 hours. The activating gas itself must be dehydrated prior to the activation procedure.

The electropositive metal component will be present in the compositions as 10 to 80 percent by volume. This component has a high affinity for water, but is inert to oxygen, which is a major component in many lens gas systems. When the lens gas has a high water content, the electropositive metal component should be in the upper end of its concentration range in the compositions, and conversely it can be in lower concentration when the water content of the lens gas is lower. The same considerations hold when there is a high contaminant content of carbon oxides.

Typically, the lens gases will have water contamination contents in the range of about 10–100 ppm, with some as low as 500 ppb. Water at 100 ppm is 4–5 orders of magnitude more concentrated than most non-atmospheric contaminants (e.g. SO$_2$ at 5 ppb). Therefore, the effective removal of water is of the utmost importance. After contact with the compositions herein, the decontaminated lens gases will have water contents no greater than about than 1 ppb, and often as low as 50 ppt. Those skilled in the photolithography art will be readily able to use the compositions of this invention in the manner described and obtain the level of decontamination required for the specific products of interest.

The High Silica Zeolite Component

The high silica zeolite component may be any of the high silica zeolites which are effective to reduce hydrocarbon gas levels down to 1 ppb or lower, and in many cases down to the order of 100 ppt. Particularly preferred zeolites are those high silica synthetic zeolites commercially available under the names Zeolite Y and ZSM-5 and their analogs.

Zeolites are a class of synthetic and natural minerals having an aluminosilicate tetrahedral framework, ion-exchangable large cations, and 10%–20% loosely held water molecules which permit reversible dehydration without significant alteration in the molecular structure. They are often referred to as "molecular sieves" because of their ability to separate gaseous and liquid molecules on the basis of molecular size. The metal cations present are primarily sodium and calcium, but may also include various alkali metal or alkaline elements such as potassium, strontium and barium. To be suitable for the present invention, the zeolites must have the water removed and also the alumina content must be reduce to a point where the silica is the predominant component of the zeolite structure. Particularly preferred in this invention are as indicated the commercial synthetic zeolites Zeolite Y and ZSM-5.

The zeolites are a well known and widely described class of natural and synthetic aluminosilicates. For the purposes of this invention, the term "zeolite" will mean any aluminosilicate, natural or synthetic, which has a crystalline structure substantially equivalent to that of the minerals classified as zeolites. The natural zeolites have been widely described in standard mineralogy texts for many years; particularly good descriptions are found in Dana, A TEXTBOOK OF MINERALOGY, pp. 640–675 (4th ed. [rev'd. by Ford]: 1932); Deer et al., AN INTRODUCTION TO THE ROCK FORMING MINERALS, pp. 393–402 (1966) and Kühl et al., "Molecular Sieves," in Ruthven, ed., ENCYCLOPEDIA OF SEPARATION TECHNOLOGY, vol. 2, pp. 1339–1369 (1997).

The synthetic zeolites, which have been developed primarily for use in chemical and petroleum catalytic processes, are often referred to by the prefix word "synthetic" attached to the name of their natural counterparts, or, for those synthetic zeolites which do not have natural counterparts, by various coined names, such as Zeolite A, Zeolite X, Zeolite Y, ZSM-5, Zeolite 13X and so forth. An excellent description of the synthetic zeolites and their manufacture and uses as catalysts will be found in the Kühl et al. reference cited above, in Elvers et al. (eds), ULLMANN'sENCYCLOPEDIA OF INDUSTRIAL CHEMISTRY, "Zeolites", vol. A28, pp. 475–504 (5th Comp. Rev. Edn., 1985) and in Kirk-Othmer, ENCYCLOPEDIA OF CHEMICAL TECHNOLOGY, "Molecular Sieves", vol. 15, pp.638–669 (3rd Edn., 1978).

Most preferred are the synthetic zeolites referred to as Zeolite Y (sometimes referred to as "Zeolite NaY") and zeolite ZSM-5. These are described in detail in ULLMANN's, supra, at p. 479 and at pp. 486 and 487, respectively. Where any zeolite, including Zeolite Y or zeolite ZSM-5, might have an unduly low $SiO_2/AL_2O_3$ ratio upon formation, that ratio can be enhanced to an appropriate level by conventional techniques such as those also described in ULLMANN'S at pages 489–490. Further, there have been developments in synthetic zeolite technology since the publication of the ULLMANN reference, such that there are now widely available commercial zeolites with high surface area, commonly in the range of 400–900 $mg^2/gm$.

The high silica zeolites useful in this invention will have a silica:alumina ratio of at least 90:1, preferably at least 300:1, and more preferably at least 400:1. A preferred range is 400–2000:1, although high silica zeolites with ratios as high as 3000:1 have been prepared and it is anticipated that the higher ratios will be preferred in specific applications. Their use is therefore contemplated in this invention when they become commercially available. Surface areas of the high silica zeolites are typically up to about 1500 $m^2/gm$, preferably in the range of 400–1500 $m^2/gm$. Most commercially available high-silica zeolites are in the range of about 400–900 $m^2/gm$. Normally the high silica zeolites are prepared by treating the original natural or synthetic zeolite with a reactant specific to alumina, so that the alumina content is substantially reduced without affecting the silica content or significantly altering the zeolite structure.

It is believed that the critical aspect which determines suitability of a particular zeolite for the present invention is the ability to undergo alumina removal without significant alteration in the zeolite structure. For instance, the preferred materials, Zeolite Y and zeolite ZSM-5 are considered to be quite suitable for decontamination of a lens gas stream, both because they are good adsorbents and also because of their structural stability in the flowing gas stream.

For most of the high silica zeolites, including the preferred high silica Zeolites Y and zeolite ZSM-5, it is preferred to activate the material prior to incorporation into the system for decontamination. Activation can be accomplished by heating the high silica zeolite in an anhydrous inert gas atmosphere (e.g., $N_2$ or Ar gas) at a temperature of about 250°–425° C. (480°–800° F.) for about 24–48 hours. The activating gas itself must be purified prior to the activation procedure.

The Late Transition Metal Oxide Component

The metal oxides useful in the claimed invention are the late transition metal oxides, specifically those of Groups 7–14 metals, preferably those of groups 10–14 metals, most preferably iron, copper, nickel or zinc oxides. These metal oxides are well known for their catalytic properties. Good adsorption properties are a key aspect of their catalytic properties. However, under normal catalytic conditions the materials' high affinity for certain compounds leads to the detrimental hindering and destroying of these properties. One well-known example of this phenomenon is "sulfur poisoning." In the present invention these detrimental adsorptive properties are exploited to remove certain contaminants from the lens gas, specifically the non-atmospheric contaminants.

The metal oxides are normally deposited on an inorganic substrate with a high surface of $\geq 100$ $m^2/g$. Many substrates ($SiO_2$, $Al_2O_3$, $TiO_2$, MgO, etc.) are suitable for this purpose and widely available. However, should the pure metal oxides become available in a high surface area form, their direct use may be desirable in the claimed invention. Therefore, one of skill in the art would understand that this embodiment is not precluded from the claimed invention.

The metal oxides need not be in their highest oxidation states. Mixed oxides which have the desired adsorption and physical properties are included in this invention. Metal oxides in various oxidation states may be present at different times in the life of the material. The oxides may be pretreated (e.g. 250–425° C., for 24–48 hours), but need not be reduced. This is mainly to remove $H_2O$, CO, and $CO_2$, as well as any hydrocarbons adsorbed by substrate. While they are not normally reduced, this is not precluded from the relevant embodiments of this invention.

The late transition metal or metal compound component of the present composition will be an active high surface area metal or metal oxide for removal of various gaseous contaminants, notably non-atmospheric contaminants such as $So_x$, $No_x$, $R_2S$, $M^+$, and HX. Reduction of contaminant level is to a level $\leq 1$ ppb, and preferably $\leq 100$ ppt. (It is recognized that for some photolithography processes may not have available contaminant measuring equipment capable of measuring contaminant concentration as low as 100 ppt or less. However, the availability, or lack thereof, of appropriate measuring equipment does not alter the various levels of decontamination which are called for and can be achieved in the present invention.) These contaminants are not adsorbed by the other two materials and present a considerable purification challenge when high concentrations of atmospheric contaminants are present. However, this material does not work effectively without the other two materials.

It is preferred that the surface area of the metal oxide-containing material be greater than 100 $m^2/g$.

This is the first known use of oxides of late transition metals in gas purification technology for the semiconductor industry. The purpose of the late transition metal oxides is to take advantage of their excellent sorption capacities for the non-atmospheric components. Additionally, the late transition metals, even in oxidized form, will have a capacity to adsorb additional atmospheric contaminants remaining in the gas stream after contact with the previous two sorbents. These include contaminants described in the Background section as belonging to Group (i), e.g., $H_2O$, and Group (vi), e.g. $CO_2$.

As noted above, many different metals and their oxides are useful in the present invention, as long as they have the requisite high surface area and maintain their structural stability (either alone, mixed or in combination with another metal oxide which has greater structural integrity in the presence of the gas stream). By "structural integrity" is meant that the metal oxide substrate can resist erosion or breakage in the presence of the flowing gas stream, and does not deteriorate by suffering reduction of surface area below the minimum 100 $m^2/g$ limit.

While the level of purification available by use of the late transition metal oxides is new to the industry, this does not negate the importance of the first two sorbent media described. Although these materials have been previously described in the gas purification art, they are used herein to effect the removal of certain contaminants that interfere with the action of the third component. Likewise, the first component removes contaminants that potentially interfere with the sorbent capacity of the second component. Therefore, the presence of all three of these materials is necessary to affect the desired sub-ppb, preferably less than 100 ppt, levels of decontamination. The amounts of each component can be varied to decontaminate a variety of types of contaminants.

This level was previously unattainable, particularly in high background levels of interfering components, specifically atmospheric contaminants. Using these three components, water concentration can be reduce by greater than six orders of magnitude. Reducing contaminants to this low level has not been necessary in the past, but at the new higher definition levels, the reduction of contaminants to the sub-ppb level is necessary. The composition leaves the lens gases themselves unaffected because the gas stream is purified without introduction of any contaminants or particulates into the gas stream.

One important and unique aspect of the present compositions is their ability to be tailored to specific contaminant profiles of individual lens gas streams. Thus where water content is high, the composition ratios can be set such that the electropositive metal component and/or the high silica zeolite component are predominant, while when oxide gases or hydrogen sulfide are high, the late transition metal components can be more dominant in the compositions.

The Composition

The claimed composition is useful for purifying gas streams used in photolithography, especially when the gas stream contains high concentrations of background contaminants and low levels of these contaminants are necessary. The percentage, by volume, of the three components is varied depending on the level and number of contaminants. It is the synergistic effects of the three components that achieves the low levels of contaminants.

The ratios of the three components may be varied according to the formula $aA+bB+cC=1$, where a, b, and c each is in the range of 0.1–0.8. The concentrations of the three principal components of the composition can be varied to enable the composition to be used for decontamination of a wide variety of potential contaminant gases in the photolithography gas stream. The composition limits are from 10 to 80 percent by volume of each component. Thus by selecting the appropriate ratios of the components, a composition of the present invention can be tailored precisely to the specific mix of contaminants in the gas stream for individual processes.

Figure 2:
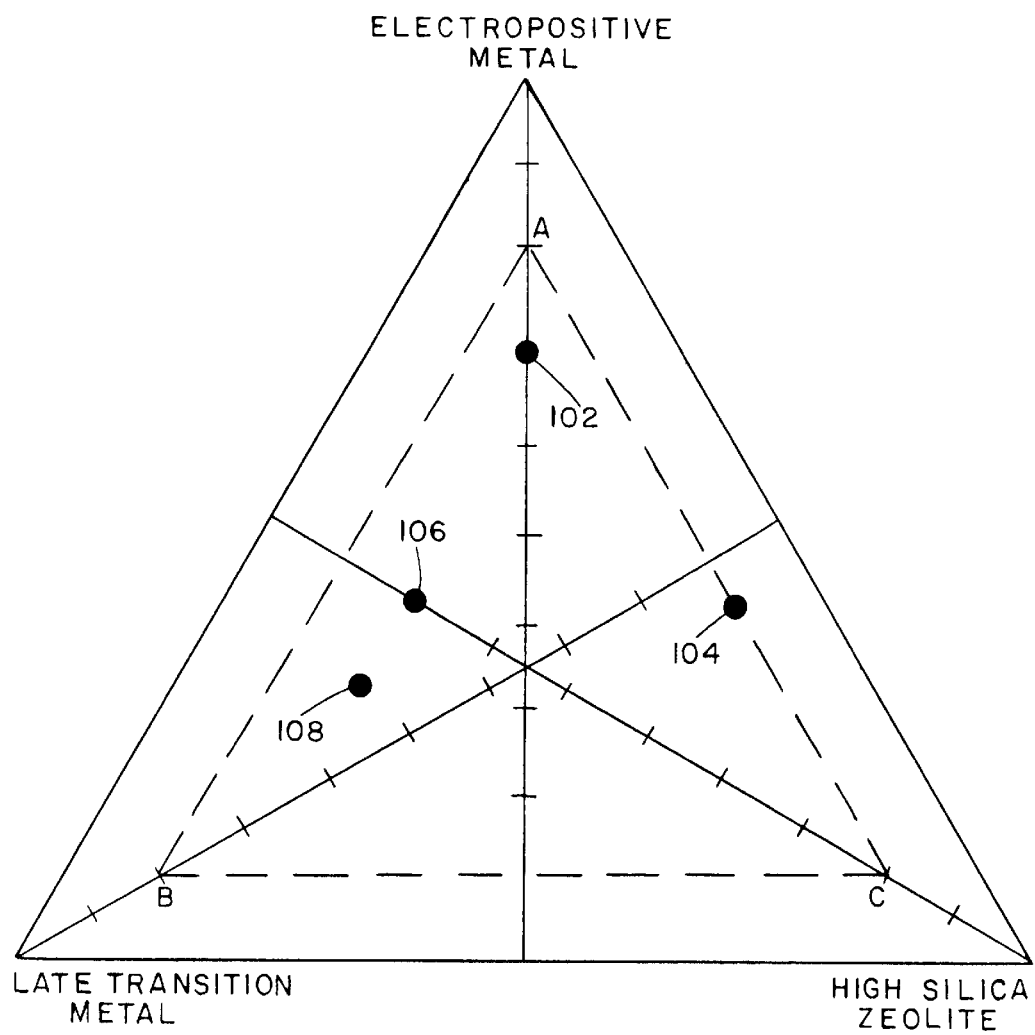
FIG. 2 is a triangular coordinate graph representing the range of compositions of this invention. The hatch marks on the vertical axes are at 10 volume percent intervals, with an apex representing 100 percent of a single component.

The ratios of the three decontamination materials may be chosen according to the specific needs of the environment, and the specific contaminants contained therein. This is best shown by the graph of FIG. 2. All of the compositions useful herein will lie on or within the line A-B-C. From the compositions that are defined by that graphed area the user will select an optimum composition depending on the type (s) of contaminants which are to be removed. Different types of contaminants will dictate compositions from different parts of the graphed area. For instance, a high concentration of Group (i) contaminants (e.g. $H_2O$ or ROH), a high concentration of Group (ii) contaminants (e.g. $NO_x$, $SO_x$, $R_2S$, or RX) and a high concentration of Group (iii) (alkaline molecules, both protic and aprotic) contaminants would require higher ratios of the electropositive material and late transition metal oxides (from left side of FIG. 2), with relatively low levels of the high silica zeolite, from the right side of the graphed area of FIG. 2. Conversely, a high concentration of Group (iii) (alkaline molecules), Group (iv) (e.g. Lewis(M+) or Bronsted (HX)), Group (v) (e.g. Hcs or siloxanes), and Group (vi) (e.g. CO or $CO_2$) contaminants will require higher ratios of the high silica zeolite and late transition metal oxide, from the lower portion of the graphed area of FIG. 2.

The following examples are given to enable those of ordinary skill in the art to more clearly understand and to practice the invention. The examples should not be considered as limiting the scope of the invention, but merely as illustrative and representative thereof. It will be understood by one skilled in the art that this invention is applicable to future lithographic and metrological advances that require gas purification.

EXAMPLE 1

A typical composition for use in a high moisture environment will contain 70% of an electropositive metal component, 15% of a high silica zeolite, and 15% of a late transition metal compound. This composition is indicated by data point 102 in FIG. 2.

EXAMPLE 2

A typical composition for use in an environment high in hydrocarbons and/or siloxanes will contain 40% of an electropositive metal component, 50% of a high silica zeolite, and 10% of a late transition metal compound. This composition is indicated by data point 104 in FIG. 2.

EXAMPLE 3

A typical composition for use in an environment high in amines and/or acids will contain 40% of an electropositive metal component, 20% of a high silica zeolite, and 40% of a late transition metal compound. This composition is indicated by data point 106 in FIG. 2.

EXAMPLE 4

A typical composition for use in an environment high in sulfur oxides or nitrogen oxides will contain 30% of an electropositive metal component, 20% of a high silica zeolite, and 50% of a late transition metal compound. This composition is indicated by data point 108 in FIG. 2.

It will be understood, of course, that each of these examples indicates a general range on and within the A-B-C region of FIG. 2 in which the various compositions are tailored to the specific type of contaminant environment. It will also be understood that such regions will have a transition between them and can even overlap, as suggested by data points 106 and 108, rather than being sharply defined or mutually exclusive. The same composition may in fact be quite useful for more than one type of contaminant environment. Those skilled in the art will have no difficulty selecting the specific composition optimum for their particular contaminant environments from the range of compositions in FIG. 2.

The compositions, as discussed above, can be in particulate, coating, pelletted, extruded, plate or powder form, or a mixture of these. Conveniently, regardless of form, a composition will be housed in a durable high purity container, such as a cannister, preferably formed of a long service life metal such as stainless steel, through which the lens gas is flowed. The inlet gas will have a certain contaminant level, most of which will be removed during the gas' transit through the cannister, so that the lens gas upon exiting from the cannister will have a much reduced contaminant load, on the order of 1 ppb or less, preferably on the order to 100 ppt. Other types of housings, containers, canisters, etc. may be used, as long as they have service lives commensurate with the service lives of the composition and the laser and are of ultra high purity. The housing, container, etc. may be a separate unit or may be incorporated into one or more units of the photolithography system, such as the wafer production chamber.

Also as discussed above, it may be advantageous to have a staged decontamination system, in which one or more conventional contaminant removal units are placed upstream (preferably) or downstream of the compositions of this invention, so that the load of individual components may be reduced somewhat prior to arrival of the lens gas at the present composition. Many such "pretreatment" units are available, especially for dehydration and particulate removal. By lessening the contaminant load of the lens gas prior to its contact of the present compositions, the present compositions operate more efficiently and have a longer service life before they become saturated or deactivated. Those skilled in the art will be well aware of such pretreating units and the details of their use.

The components can be used in a variety of different embodiments. In a preferred embodiment, the titania is in the physical form of pellets or large granules. One can simply pass the lens gas through the composition disposed in body consisting substantially or essentially of the three components in pellet or granule form, or the like. The components can also be in the form of a body of comminuted fine powders. However, since it is preferred to keep the system gas pressure drop below 1–5 mbar and maintain high gas flow rates, using such powders may cause a greater pressure drop in the gas stream, so it is preferred to used the powdered form only in high lens gas pressure systems. It is thus possible to have different forms of the compositions and components for gas streams of different pressures, by using different physical sizes. With the smaller particle or granule sizes care must be taken to minimize entrainment.

It will be evident that there are numerous embodiments of the present invention which are not expressly described above but which are clearly within the scope and spirit of the present invention. The above description is therefore intended to be exemplary only, and the actual scope of the invention is to be determined from the appended claims.

We claim:

1. A method of decontaminating a gas intended for use in photolithography and metrology to remove from the gas or reduce the concentration in the gas of a contaminant which interferes with light transmittance, which comprises removing said contaminant from the gas by passing the gas through a body of decontaminant comprising 10 to 80 percent by volume of an electropositive metal component; 10 to 80 percent by volume of a high silica zeolite; and 10 to 80 percent by volume of a late transition metal compound, wherein each component comprises at least 10 percent by volume of said composition and the total of the components equals 100 percent by volume.

2. A method as in claim 1 wherein the body of the decontaminant comprises a mixture of an electropositive metal component, a high silica zeolite, and a late transition metal compound in a ratio on or within the area bounded by the line A-B-C in FIG. 2.

3. A method as in claim 1 further comprising removal of the contaminant prior to or after treatment of the gas to remove solid particulate matter from the gas.

4. A method as in claim 1 wherein the contaminant is gaseous.

5. A method as in claim 4 wherein the contaminant comprises a neutral polar gaseous molecule.

6. A method as in claim 4 wherein the contaminant comprises a neutral polar aprotic molecule.

7. A method as in claim 4 wherein the contaminant comprises a protic or aprotic alkaline molecule.

8. A method as in claim 4 wherein the contaminant comprises an acidic polar species.

9. A method as in claim 4 wherein the contaminant comprises an environmental gas.

10. A method as in claim 1 wherein the contaminant comprises at least one of gaseous or entrained water, an alcohol, a nitrogen oxide, a sulfur oxide, an organic sulfide, an organic halide, an amine, a hydrocarbon, a siloxane, a carbon oxide and an environmental gas.

11. A method as in claim 1 wherein the gas after decontamination is used in photolithography.

12. A method as in claim 1 wherein the gas after decontamination is used in metrology.

13. A method as in claim 1 wherein the concentration of the contaminant in the gas is reduced to not more than 1 ppb.

14. A method as in claim 13 wherein the concentration of the contaminant in the stream is reduced to not more than 100 ppt.

15. A method as in claim 1 wherein the contaminant removed or reduced comprises a contaminant which interferes with transmittance of light having a wavelength of 248 nm.

16. A method as in claim 15 wherein the concentration of the contaminant in the gas is reduced to not more than 1 ppb.

17. A method as in claim 1 wherein the contaminant removed or reduced comprises a contaminant which interferes with transmittance of light having a wavelength of 193 nm.

18. A method as in claim 17 wherein the concentration of the contaminant in the gas is reduced to not more than 100 ppt.

19. A method as in claim 1 wherein the contaminant removed or reduced comprises a contaminant which interferes with transmittance of light having a wavelength of 157 nm.

20. A method as in claim 19 wherein the concentration of the contaminant in the gas is reduced to not more than 100 ppt.

21. A method as in claim 1 wherein the contaminant removed or reduced comprises a contaminant which interferes with transmittance of light having a wavelength $\leq 100$ nm.

22. A method as in claim 21 wherein the concentration of the contaminant in the gas is reduced to not more than 1 ppt.

23. A method as in claim 1 further comprising providing a generator of coherent light as a source of light for the photolithography or metrology.

24. A method as in claim 23 wherein the generator of coherent light comprises a laser.

25. A method as in claim 1 further comprising a providing a generator of noncoherent light as a source of light for the photolithography or metrology.

* * * * *